United States Patent [19]
Wada et al.

[11] Patent Number: 6,008,674
[45] Date of Patent: Dec. 28, 1999

[54] SEMICONDUCTOR INTEGRATED CIRCUIT DEVICE WITH ADJUSTABLE HIGH VOLTAGE DETECTION CIRCUIT

[75] Inventors: Tomohisa Wada; Masaaki Mihara; Yasuhiko Taito; Yoshikazu Miyawaki; Katsumi Dosaka, all of Tokyo, Japan

[73] Assignee: Mitsubishi Denki Kabushiki Kaisha, Tokyo, Japan

[21] Appl. No.: 08/927,796

[22] Filed: Sep. 11, 1997

[30]  Foreign Application Priority Data

Apr. 11, 1997 [JP] Japan ................................ P09-093598

[51] Int. Cl.$^6$ .................................................. H03K 5/153
[52] U.S. Cl. ................................................ 327/89; 327/77
[58] Field of Search .................................. 327/74, 75, 77, 327/80, 81, 88, 89, 143, 198, 541, 543

[56]  References Cited

U.S. PATENT DOCUMENTS

| | | | |
|---|---|---|---|
| 5,083,045 | 1/1992 | Yim et al. | 327/80 |
| 5,280,198 | 1/1994 | Almulla | 327/80 |
| 5,283,762 | 2/1994 | Fujishima | 365/189.09 |
| 5,512,849 | 4/1996 | Wong | 327/77 |
| 5,760,614 | 6/1998 | Ooishi et al. | 327/77 |

*Primary Examiner*—Toan Tran
*Attorney, Agent, or Firm*—McDermott, Will & Emery

[57]  ABSTRACT

A semiconductor integrated circuit device with a high voltage detection circuit comprises a high voltage step-down circuit for stepping down a high voltage input and outputting the stepped-down voltage, a reference voltage generator for generating plural reference voltages, a reference voltage selector for selecting one of the plural reference voltages, a high voltage detection circuit for comparing the stepped down voltage with the selected reference voltage to detect a high voltage and a control circuit for controlling the voltage drop of the high voltage and selection of the plural reference voltages to set the high voltage to be detected by the high voltage detector. There is also disclosed semiconductor integrated circuit having a high voltage step-down circuit for outputting plural stepped-down voltages having a fine tuner for fine-tuning each of the plural stepped-down voltages wherein a stepped-down voltage having been tuned finely is compared with a reference voltage given by a reference voltage generator.

6 Claims, 9 Drawing Sheets

SEMICONDUCTOR INTEGRATED CIRCUIT DEVICE WITH ADJUSTABLE HIGH VOLTAGE DETECTION CIRCUIT

BACKGROUND OF THE INVENTION

1. Field of the Invention

The present invention relates to a semiconductor integrated circuit device, and relates particularly to a high voltage detection circuit for detecting high positive and negative voltages input to a semiconductor integrated circuit device.

2. Description of the Prior Art

Flash memory is one type of nonvolatile semiconductor memory device capable of storing data without being continuously supplied with current, a task which is accomplished by holding a charge in the floating gate inside the memory cell at which data is stored. Data is stored by charging or discharging the appropriate floating gate using the Fowler-Nordheim tunnel effect or channel hot electrons to store values of 1 and 0. A voltage that is higher than the operating voltage of the device is generally needed to charge or discharge the floating gate.

FIG. 8 is a simplified circuit diagram of a conventional high voltage detection circuit for detecting a high positive voltage. As shown in FIG. 8 the high voltage detection circuit 200 comprises a current mirror load differential amplifier circuit 201, an n-channel MOSFET (nMOS transistor) 202 for controlling the differential amplifier circuit 201, resistors 204 and 205 for voltage dividing the high positive voltage input from a high voltage input terminal 203, an inverter 206 and a reference voltage generator 207. The high voltage input terminal 203 is grounded through resistors 204 and 205.

Note that the reference voltage Vref generated and output by the reference voltage generator 207 is supplied to one input terminal of the differential amplifier circuit 201. The other input terminal is connected between the resistors 204 and 205, and is supplied thereby with the voltage-divided high positive voltage Vh (voltage Vdiv) input from the high voltage input terminal 203.

The output of the differential amplifier circuit 201 is input to the inverter 206, and the output of the inverter 206 is the output of the high voltage detection circuit 200. The high voltage detection circuit 200 outputs to a high voltage generator 208, which comprises a charge pump circuit and outputs the high positive voltage Vh.

The output of the high voltage generator 208 is supplied to a particular circuit, not shown in the figures, and to the high voltage input terminal 203. A digital signal is supplied to the gate of the nMOS transistor 202. When the nMOS transistor 202 is on, the differential amplifier circuit 201 operates, and when the nMOS transistor 202 is off, the differential amplifier circuit 201 stops operating.

With the high voltage detection circuit 200 thus comprised, the divided voltage Vdiv voltage-divided by the resistors 204 and 205 is $$Vdiv=Vh\times Rb/(Ra+Rb)$$

where Ra is the resistance of resistor 204 and Rb is the resistance of resistor 205.

The differential amplifier circuit 201 compares the divided voltage Vdiv and reference voltage Vref. When Vdiv<Vref, the differential amplifier circuit 201 outputs LOW. The inverter 206 thus outputs HIGH, which causes the high voltage generator 208 to drive the charge pump and step up the high positive voltage Vh. When Vdiv>Vref, the differential amplifier circuit 201 outputs HIGH, the inverter 206 thus outputs LOW, and the high voltage generator 208 stops driving the charge pump. Because Vdiv=Vh×Rb/(Ra+Rb), the high voltage detection circuit 200 outputs LOW when Vh×Rb/(Ra+Rb)>Vref, i.e., when Vh>Vref×(Ra+Rb)/Rb, and can therefore detect whether the high positive voltage Vh is less than or equal to Vref×(Ra+Rb)/Rb.

The high voltage detection circuit 200 shown in FIG. 8, however, divides the high positive voltage Vh using two resistors 204 and 205, and therefore can only detect one divided voltage Vdiv. As a result, this high voltage detection circuit 200 obviously cannot detect plural high positive voltage values. This problem is resolved by replacing the one resistor 204 with a series circuit of n (where n is a natural number) resistors R1–Rn and nMOS transistors T1–Tn with a sufficiently small gate parallel connected to the corresponding resistors R1–Tn.

Each of the nMOS transistors T1–Tn is connected to a control circuit 211. The control circuit 211 controls the on/off state of each nMOS transistor T1–Tn to control the total resistance of the series circuit comprising the n resistors R1–Rn. It is therefore possible for the control circuit 211 to control the divided voltage Vdiv, and thereby detect plural high voltage values.

A conventional detection circuit for detecting high negative voltage values is described next with reference to the circuit diagram shown in FIG. 10.

The high voltage detection circuit 220 shown in FIG. 10 comprises a current mirror load differential amplifier circuit 221, a differential sense amplifier 224 comprising an inverter 223 and nMOS transistor 222 for controlling the differential amplifier circuit 221, a level converter 227 comprising p-channel MOSFETs (pMOS transistors) 225 and 226, and nMOS transistors 228, 229, and M1–Mn.

The source is connected to the back-gate terminal in pMOS transistors 225 and 226 and nMOS transistors 229 and M1–Mn to use the back-gate effect preventing variation in the threshold value Vth. pMOS transistor 226 and nMOS transistors 228, 229, and M1–Mn are diode connected.

nMOS transistors 228, 229, and M1–Mn are serially connected to create a series circuit connected between the high voltage input terminal 230 to which the high negative voltage Vl is input and the power supply terminal 231 to which the power supply voltage Vdd is input. The reference voltage VrefA generated by the reference voltage generator 232 is supplied to the gate of nMOS transistor 228. nMOS transistor 229 is connected between nMOS transistor 228 and the power supply terminal 231.

The pMOS transistors 225 and 226 forming the level converter 227 are connected in series. The gate of pMOS transistor 225, which is connected between the power supply terminal 231 and the ground on the power supply terminal side, is connected between nMOS transistors 228 and 229.

One input to the differential amplifier circuit 221 of the differential sense amplifier 224 is connected between the pMOS transistors 225 and 226 of the level converter 227, and the other input is connected to the reference voltage VrefB generated by the reference voltage generator 232. The differential amplifier circuit 221 outputs to the inverter 223, which outputs the output of the high voltage detection circuit 220 to the high voltage generator 233. The high voltage generator 233 comprises a charge pump circuit to generate and output a high negative voltage Vl.

The output of the high voltage generator 233 is supplied to a particular circuit, not shown in the figures, and to the high voltage input terminal 230. A digital signal is supplied to the gate of the nMOS transistor 222. When the nMOS transistor 222 is on, the differential amplifier circuit 221 operates, and when the nMOS transistor 222 is off, the differential amplifier circuit 221 stops operating.

The series circuit comprising the diode-connected nMOS transistors M1–Mn and nMOS transistor 228, to the gate of which is input the reference voltage VrefA, passes current according to the voltage difference between the reference voltage VrefA and the high negative voltage V1. This current flows from the diode connected nMOS transistor 229, producing a voltage Va between the source and drain of the nMOS transistor 229. All of the nMOS transistors 228, 229, and M1–Mn have gates of the same size, and the following equation [1] is true when all are on.

$$(VrefA-V1)/(n30\ 1)=Va \quad [1]$$

The level converter 227 converts the input voltage Va to a voltage Va referenced to the ground potential, and the differential amplifier circuit 221 compares the voltage Va converted by the level converter 227 with the reference voltage VrefB. As a result, reference voltage VrefB is compared with (VrefA−V1)/(n+1), V1 is compared with {VrefA−(n+1))×VrefB}, and high negative voltages can be detected by using a high integer value for n.

The problem with the high positive voltage detection circuit 210 shown in FIG. 9 is that the number of resistors R1–Rn must be increased to adjust the divided voltage Vdiv in fine increments. This increases the number of outputs from the control circuit 211, which increases the size of the circuit. The chip size also grows as the number of resistors increases, and both factors increase device cost.

With the high negative voltage detection circuit 220 shown in FIG. 10 the large number of circuit elements invites a drop in detection precision while also increasing cost and current consumption. This thus also conflicts with the constant desire to reduce current consumption in semiconductor devices.

SUMMARY OF THE INVENTION

Therefore, an object of the present invention is to resolve the above problems by providing a semiconductor integrated circuit device comprising a high voltage detection circuit capable of improving detection precision, reducing device cost, and reducing current consumption.

It should be noted that, while differing in object and construction from the semiconductor integrated circuit device of the present invention, the battery voltage detection circuit for a magnetic recording and reproducing apparatus disclosed in Japan Unexamined Patent Publication (kokai) 5-164792 (1993-164792) adjusts and inputs a reference voltage VREF together with the detection voltage to a comparator. An internal voltage generating circuit that changes the reference voltage VREF in steps is also disclosed in U.S. Pat. No. 5,283,762.

In a semiconductor integrated circuit device with a high voltage detection circuit for detecting high voltage levels according to the present invention, a high voltage step-down means steps down a high voltage input and outputs the stepped-down voltage. A reference voltage generating means generates and outputs plural reference voltages, and a reference voltage selection means selects one of the plural reference voltages supplied from the reference voltage generating means, and outputs the selected reference voltage. A high voltage detection means compares the voltage output from the high voltage step-down means and the reference voltage output from the reference voltage selection means to detect a high voltage. A controller controls the voltage drop of the high voltage by the high voltage step-down means and controls the reference voltage selected by the reference voltage selection means to set the high voltage detected by the high voltage detection means.

The high voltage step-down means in this case preferably comprises a voltage step-down circuit for stepping down a high voltage by means of at least one diode-connected MOSFET connected in series, a current supply connected in series with the voltage step-down circuit, and switching means for shorting the drain and source of each MOSFET of the voltage step-down circuit by a switching operation. The controller thus controls the voltage output from the high voltage step-down means by controlling the operation of the switching means to change the voltage drop of the voltage step-down circuit.

Alternatively, the high voltage step-down means preferably comprises a voltage step-down circuit for stepping down a high voltage by means of plural resistances connected in series, a current supply connected in series with the voltage step-down circuit, and switching means parallel connected to the resistances forming the voltage step-down circuit for shorting the resistances by a switching operation. The controller thus controls the voltage output from the high voltage step-down means by controlling the operation of the switching means to change the voltage drop of the voltage step-down circuit.

In a semiconductor integrated circuit device with a high voltage detection circuit for detecting high voltage levels according to a further embodiment of the invention, a high voltage step-down means steps down a high voltage input and outputs the stepped-down voltage. A reference voltage generating means generates and outputs a reference voltage, and a high voltage detection means compares the voltage output from the high voltage step-down means and the reference voltage output from the reference voltage generating means to detect a high voltage. The controller thus controls the high voltage voltage drop by the high voltage step-down means to set the high voltage detected by the high voltage detection means. The high voltage step-down means in this embodiment preferably comprises a voltage step-down means for stepping down the voltage in specific integer multiples of a predetermined voltage, a tuning means for stepping down the voltage in steps less than an integer multiple of the predetermined voltage, and a current supply for supplying current to the voltage step-down means and the tuning means. The controller thus specifically controls the voltage drop by the voltage step-down means and tuning means to control the voltage output from the high voltage step-down means and thereby set the high voltage detected by the high voltage detection means.

The voltage step-down means in this embodiment preferably comprises a voltage step-down circuit comprising at least one diode-connected MOSFET connected in series, and a first switching circuit comprising switching elements for shorting the drain and source of each MOSFET of the voltage step-down circuit by a switching operation. The controller thus sets the high voltage value detected by the high voltage detection means by controlling the operation of each switching element in the first switching circuit to control the voltage drop of the high voltage by the high voltage step-down means, and thereby controls the voltage output from the high voltage step-down means.

Further preferably, the tuning means comprises a fine-tuning circuit connected in series with the voltage step-down circuit, and a second switching circuit. The fine-tuning circuit comprises at least one serially connected MOSFET where a voltage dividing circuit formed by a resistance is connected between the source and drain of each MOSFET, and the voltage divided by said voltage dividing circuit is input to the MOSFET gate. The second switching circuit comprises, for each MOSFET in the fine-tuning circuit, a switching element that is switched to short the drain and source of the corresponding MOSFET. The controller thus sets the high voltage value detected by the high voltage detection means by controlling the operation of each switching element in the second switching circuit to adjust in small increments the voltage drop of the high voltage by the high voltage step-down means, and thereby control the voltage output from the high voltage step-down means in small increments.

Alternatively, the tuning means is a fine-tuning circuit connected in series with the voltage step-down circuit. This fine-tuning circuit comprises a series circuit and at least one like parallel-connected series circuit. Each of these series circuits has a MOSFET, which has a voltage dividing circuit formed from a resistance connected between the source and drain with the voltage divided by said voltage dividing circuit input to the MOSFET gate, and a switching MOSFET connected in series with said MOSFET. The controller in this case sets the high voltage value detected by the high voltage detection means by controlling the switching operation of each switching MOSFET to adjust in small increments the voltage drop of the high voltage by the high voltage step-down means, and thereby control the voltage output from the high voltage step-down means in small increments.

Yet further alternatively, the tuning means is a fine-tuning circuit connected in series with the voltage step-down circuit where said fine-tuning circuit comprises a MOSFET with at least one series circuit, which has a resistance and a switching MOSFET, connected between the gate and drain and between the gate and source of the MOSFET. The controller sets the high voltage value detected by the high voltage detection means by controlling the switching operation of each switching MOSFET to adjust in small increments the voltage drop of the high voltage by the high voltage step-down means, and thereby control the voltage output from the high voltage step-down means in small increments.

In a semiconductor integrated circuit device with a high voltage detection circuit for detecting high voltage levels according to a further embodiment of the invention, a reference voltage generating means generates and outputs a first reference voltage and a second reference voltage. A current conversion means converts the voltage difference between the first reference voltage and the high voltage to a current value, and a constant current generator generates and outputs a constant current according to the second reference voltage. A voltage conversion means converts the current difference between the current converted by the current conversion means and the constant current output from the constant current generator to a voltage, and a high voltage detection means detects the high voltage value of the voltage converted by the voltage conversion means.

The voltage conversion means in this embodiment is preferably a current mirror circuit which applies the current converted by the current conversion means to the output of the constant current generator. The high voltage detection means then detects the high voltage value of the voltage in the output of the constant current generator.

In this case the current conversion means preferably comprises a voltage level conversion circuit of at least one diode-connected MOSFET connected in series, and a MOSFET that is connected to the input of the voltage level conversion circuit, has the first reference voltage input to the gate, and functions as the input of the current conversion means. To the output of the voltage level conversion circuit a high negative voltage is applied.

In a semiconductor integrated circuit device with a high voltage detection circuit for detecting high voltage levels according to a further embodiment of the invention, a first voltage step-down means of at least one diode-connected MOSFET is connected in series and has a grounded output. A second voltage step-down means of at least one diode-connected MOSFET is also connected in series and has a high negative voltage applied to the output. A reference voltage generating means generates and outputs a particular reference voltage. A constant current generator generates a constant current whereby the input of the first voltage step-down means becomes a particular reference voltage, and outputs said constant current to the first and second voltage step-down means. A high voltage detection means then compares the input voltage to the first voltage step-down means with the input voltage to the second voltage step-down means to detect the high voltage value.

BRIEF DESCRIPTION OF THE DRAWINGS

The present invention will become more fully understood from the detailed description given below and the accompanying diagrams wherein.

DESCRIPTION OF PREFERRED EMBODIMENTS

The preferred embodiments of the present invention are described below with reference to the accompanying figures.

Embodiment 1

Figure 1:
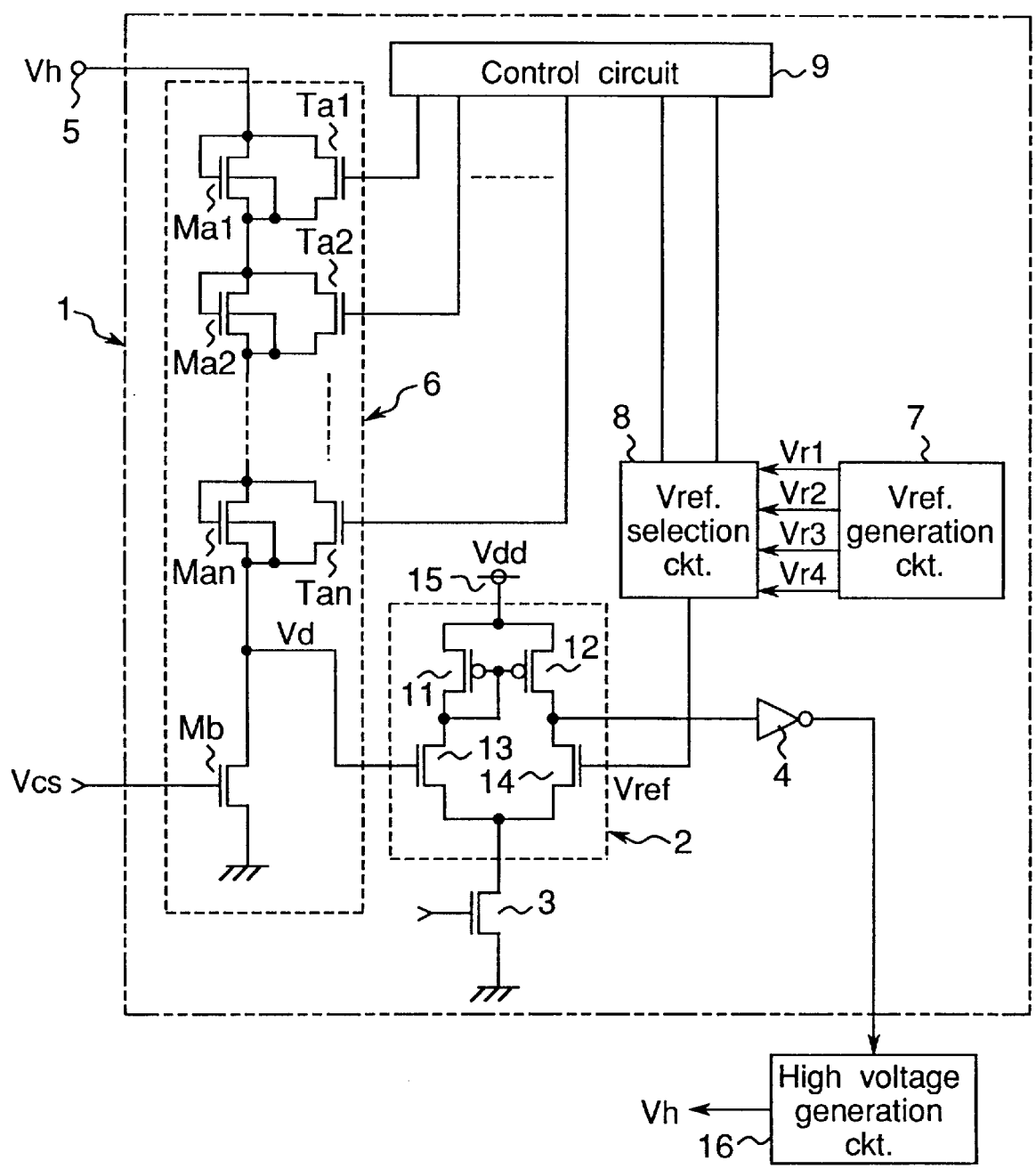
FIG. 1 is a basic circuit diagram of a high voltage detection circuit for a semiconductor integrated circuit device according to the first embodiment of the present invention.

FIG. 1 is a basic circuit diagram of a high voltage detection circuit 1 for a semiconductor integrated circuit device according to the first embodiment of the present invention. Note that a high voltage detection circuit for detecting high positive voltages is shown in FIG. 1 by way of example only.

As shown in FIG. 1, the high voltage detection circuit 1 comprises a current mirror load differential amplifier 2, an n-channel MOSFET (nMOS transistor) 3 for controlling the differential amplifier 2 and an inverter 4 for inverting the level of the output signal from the differential amplifier 2, a high voltage step-down circuit 6, a reference voltage generator 7, a reference voltage selector 8, and a control circuit 9.

The high voltage step-down circuit 6 steps down the high positive voltage input from the high voltage input terminal 5 to output a step-down voltage Vd. The reference voltage generator 7 generates plural reference voltages, shown as Vr1–Vr4 in this embodiment, and outputs to the reference voltage selector 8. The reference voltage selector 8 is controlled by the control circuit 9 to select and output one of the reference voltages Vr1–Vr4 to the differential amplifier 2.

In addition to controlling the reference voltage selector 8, the control circuit 9 controls the high voltage step-down circuit 6 to regulate the level of the step-down voltage Vd output from the high voltage step-down circuit 6 to the differential amplifier 2.

The differential amplifier 2 comprises p-channel MOSFETs (pMOS transistor) 11 and 12 and nMOS transistors 13 and 14. The pMOS transistors 11 and 12 form a current mirror with the sources of both pMOS transistors 11 and 12 connected to the power supply terminal 15 to which power supply voltage Vdd is applied. The gate of pMOS transistor 11 is connected to the gate of pMOS transistor 12, and the line between these gates is connected to the drain of pMOS transistor 11.

The drain of pMOS transistor 11 is connected to the drain of nMOS transistor 13. The drain of pMOS transistor 12 is connected to the drain of nMOS transistor 14, and the line therebetween is tapped for the output of the differential amplifier 2, which is supplied to the input of the inverter 4. The output of the inverter 4 is the output of the high voltage detection circuit 1, and is supplied to the input of the high voltage generator 16.

The high voltage generator 16 comprises a charge pump, and outputs the high positive voltage Vh. The high voltage generator 16 outputs both to a particular circuit, which is not shown in the figures, and to the high voltage input terminal 5 of the high voltage detection circuit 1.

The source of the nMOS transistor 13 is connected to the source of the nMOS transistor 14, and the line therebetween is connected to the drain of the nMOS transistor 3. The source of nMOS transistor 3 is grounded. A digital signal is supplied to the gate of nMOS transistor 3 to switch the nMOS transistor 3 on or off. When nMOS transistor 3 is on, the differential amplifier 2 operates. When nMOS transistor 3 is off, the differential amplifier 2 stops operating.

The step-down voltage Vd output from the high voltage step-down circuit 6 is supplied to the gate of nMOS transistor 3. The reference voltage selected by the reference voltage selector 8 is supplied to the gate of nMOS transistor 14. As described above, the reference voltage selector 8 is connected to the reference voltage generator 7 from which the reference voltages Vr1–Vr4 are input, and is further connected to the control circuit 9.

The high voltage step-down circuit 6 comprises n diode-connected nMOS transistors Ma1–Man, and nMOS transistor Mb. The nMOS transistors Ma1–Man are connected in series with the drain of nMOS transistor Ma1 connected to the high voltage input terminal 5. The source of nMOS transistor Man is connected to the drain of nMOS transistor Mb, and the line therebetween is connected to the gate of nMOS transistor 13 in the differential amplifier 2. The source of nMOS transistor Mb is grounded, and a particular voltage Vcs is input to the gate of nMOS transistor Mb.

Parallel connected to nMOS transistors Ma1–Man are corresponding nMOS transistors Ta1–Tan. The gates of nMOS transistors Ta1–Tan are sufficiently short or wide so that the on resistance is sufficiently low, and the gate of each nMOS transistor Ta1–Tan is connected to the control circuit 9. The source and back-gate terminals of each nMOS transistor Ma1–Man are connected to prevent variation in the respective threshold values Vth by means of the back-gate effect. The gate size is the same in all nMOS transistors Ma1–Man and Mb, and the nMOS transistors operate in the saturation range.

It should be noted that the differential amplifier 2, nMOS transistor 3, and inverter 4 function as the high voltage detection means of the claims, the high voltage step-down circuit 6 functions as the high voltage step-down means, the reference voltage generator 7 as the reference voltage generating means, the reference voltage selector 8 as the reference voltage selection means, and the control circuit 9 as the controller.

The nMOS transistor Mb thus operates as a current source. When the control circuit 9 turns all of the nMOS transistors Ta1–Tan off and the particular voltage Vcs is input to the gate of the nMOS transistor Mb, current flows to the series circuit comprising nMOS transistors Ma1–Man, and voltage Vcs is dropped between the source and drain of each nMOS transistor Ma1–Man. The resulting voltage drop Vd from the high voltage step-down circuit 6 can thus be expressed by equation [2] below.

$$Vd = Vh - n*Vcs \qquad [2]$$

When the control circuit 9 turn K of the n nMOS transistors Ta1–Tan off, the high positive voltage Vh detected by the high voltage detection circuit 1 is expressed by equation [3]

$$Vh = Vref + K*Vcs \qquad [3]$$

where K is an integer from 0 to n.

By controlling the reference voltage selector 8, the control circuit 9 selects one of the plural reference voltages Vr1–Vrn produced by the reference voltage generator 7, and outputs the selected reference voltage as the reference voltage Vref of the differential amplifier 2. Turning the nMOS transistor 3 on causes the differential amplifier 2 to operate and differentially amplify the step-down voltage Vd supplied from the high voltage step-down circuit 6 and the reference voltage Vref supplied from the reference voltage selector 8.

For example, when the step-down voltage Vd is lower than the reference voltage Vref, the input to the inverter 4 is LOW and a HIGH signal is thus output to the high voltage generator 16. The charge pump of the high voltage generator 16 thus steps up the high positive voltage Vh. When the step-down voltage Vd is then greater than the reference voltage Vref, the input to the inverter 4 is HIGH and a LOW signal is output to the high voltage generator 16. The high voltage generator 16 thus stops the charge pump and the high positive voltage Vh is not stepped up.

The control circuit 9 thus changes the step-down voltage Vd by changing the number K of on nMOS transistors Ta1–Tan. By controlling the reference voltage selector 8 to change the reference voltage Vref input to the differential amplifier 2, it is also possible to control in small increments the high positive voltage Vh detected by the high voltage detection circuit 1.

A semiconductor integrated circuit device comprising a high voltage detection circuit according to the first embodiment of the invention can thus adjust the detectable high positive voltage Vh in fine increments by changing the step-down voltage Vd input to the differential amplifier 2 from the high voltage step-down circuit 6 and by changing the reference voltage Vref input to the differential amplifier 2.

It is also possible to reduce the size of the semiconductor integrated circuit device chip because the high voltage step-down circuit 6 is achieved using nMOS transistors and no resistors. This also reduces the device cost and current consumption.

It will also be obvious to those skilled in the art that diode-connected pMOS transistors can be used in place of the diode-connected nMOS transistors of the high voltage step-down circuit 6 in the above embodiment while achieving the same effect.

It is also possible to use resistors in place of the nMOS transistors Ma1–Man used in the high voltage step-down circuit 6 above. The number of resistors used in this case is less than that required in a conventional high voltage step-down circuit, and the number of wiring lines can be reduced.

Embodiment 2

Figure 2:
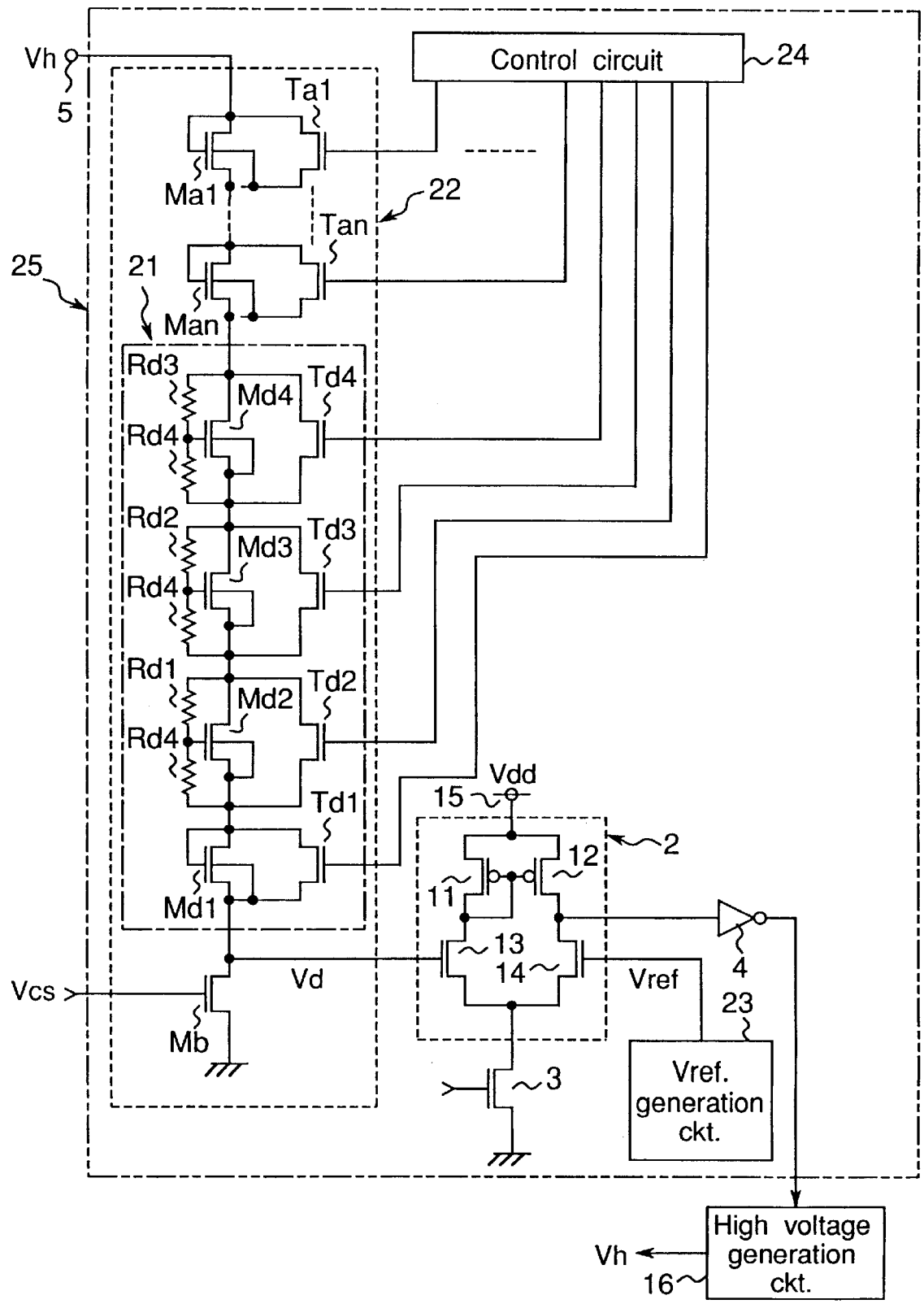
FIG. 2 is a basic circuit diagram of a high voltage detection circuit for a semiconductor integrated circuit device according to the second embodiment of the present invention.

FIG. 2 is a basic circuit diagram of a high voltage detection circuit 25 for a semiconductor integrated circuit device according to the second embodiment of the present invention. Note that a high voltage detection circuit for detecting high positive voltages is shown in FIG. 2 by way of example only. Note, further, that like parts are identified by the same reference numbers in FIG. 1 and FIG. 2, and further description thereof is omitted below. Only the differences from the embodiment shown in FIG. 1 are described below.

The second embodiment shown in FIG. 2 differs from the first embodiment in FIG. 1 in that the reference voltage selector 8 has been eliminated and a tuning circuit 21 for adjusting the step-down voltage Vd in small steps is instead provided in the high voltage step-down circuit 6. In addition, the reference voltage generator 7 generates and outputs a single known reference voltage. The high voltage step-down circuit 6 in FIG. 1 is therefore referenced as high voltage step-down circuit 22 below, and the reference voltage generator 7 as reference voltage generator 23. The control circuit in this embodiment further controls the tuning circuit 21, and is therefore referenced as control circuit 24. The high voltage detection circuit 1 of FIG. 1 is therefore likewise referenced as high voltage detection circuit 25.

The high voltage detection circuit 25 shown in FIG. 2 thus comprises a differential amplifier 2, an nMOS transistor 3 for controlling the differential amplifier 2 and an inverter 4 for inverting the level of the output signal from the differential amplifier 2, a high voltage step-down circuit 22, a reference voltage generator 23, and a control circuit 24.

The high voltage step-down circuit 22 steps down the high positive voltage input from the high voltage input terminal 5 to output a step-down voltage Vd. The reference voltage generator 23 a known reference voltage Vref and outputs to the differential amplifier 2. The control circuit 24 controls the high voltage step-down circuit 22 to regulate the level of the step-down voltage Vd output from the high voltage step-down circuit 22 to the differential amplifier 2.

The high voltage step-down circuit 22 comprises n nMOS transistors Ma1–Man, nMOS transistor Mb, and tuning circuit 21.

The tuning circuit 21 comprises nMOS transistors Md1–Md4 and Td1–Td4, resistances Rd1–Td3, and three resistances Rd4.

The source of diode-connected nMOS transistor Md1 is connected to the drain of nMOS transistor Mb, and the line therebetween is connected to the gate of nMOS transistor 13 of differential amplifier 2.

The drain of nMOS transistor Md1 is connected to the source of nMOS transistor Md2, the drain of nMOS transistor Md2 is connected to the source of nMOS transistor Md3, and the drain of nMOS transistor Md3 is connected to the source of nMOS transistor Md4. The drain of nMOS transistor Md4 is connected to the source of nMOS transistor Man.

Similarly to nMOS transistors Ta1–Tan, corresponding nMOS transistors Td1–Td4 are parallel connected to nMOS transistors Md1–Md4. The gates of nMOS transistors Td1–Td4 are sufficiently short or wide so that the on resistance is sufficiently low, and the gate of each nMOS transistor Td1–Td4 is connected to the control circuit 24. The source and back-gate terminals of each nMOS transistor Ma1–Ma$n$ and Md1–Md4 are connected to prevent variation in the respective threshold values Vth by means of the back-gate effect. The gate size is also the same in all nMOS transistors Md1–Md4, Ma1–Ma$n$ and Mb, and the nMOS transistors operate in the saturation range.

A resistance Rd4 is connected between the gate and source of nMOS transistor Md2, and resistance Rd1 is connected between the gate and drain. Resistance Rd4 is connected between the gate and source of nMOS transistor Md3, and resistance Rd2 is connected between the gate and drain. Resistance Rd4 is likewise connected between the gate and source of nMOS transistor Md4, and resistance Rd3 is connected between the gate and drain.

Note that here if the resistance of resistance Rd1 is r, the resistance of resistance Rd2 is 2r, the resistance of resistance Rd3 is 3r, and the resistance of resistance Rd4 is 4r.

Note, further, that the tuning circuit 21 is the tuning means of the claims, the high voltage step-down circuit 22 functions as the high voltage step-down means, the reference voltage generator 23 as the reference voltage generating means, and nMOS transistors Ma1–Man and nMOS transistors Ta1–Tan as the voltage step-down means.

Thus comprised, when the control circuit 24 turns all of the nMOS transistors Ta1–Ta$n$ on, nMOS transistors Td1–Td3 on, turns only nMOS transistor Td4 off, and the known voltage Vcs is applied to the gate of nMOS transistor Mb, current flows to the series circuit of nMOS transistors Ma1–Man, and to the series circuit of nMOS transistors Md4, Td3, Td2, and Td1. As a result, voltage Vcs is dropped between the source and drain of each nMOS transistor Ma1–Man, and between the gate and source of nMOS transistor Md4. The final voltage drop Vd4 between the gate and source of nMOS transistor Md4, i.e., the voltage drop of the tuning circuit 21, can thus be expressed by equation [4] below.

$$Vd4 = (7/4)*Vcs = 1.75*Vcs \quad [4]$$

Similarly, if nMOS transistors Td1, Td2, and Td4 are on and Td3 is off, the voltage drop of the tuning circuit 21 will be 1.5 * Vcs. If nMOS transistors Td1, Td3, and Td4 are on and Td2 is off, the voltage drop of the tuning circuit 21 will be 1.25 * Vcs. If nMOS transistors Td2, Td3, and Td4 are on and Td1 is off, the voltage drop of the tuning circuit 21 will be Vcs.

Note that the values of resistances Rd1–Rd4 are set so that the current flowing to resistances Rd1–Rd4 is sufficiently less than the current flowing to the high voltage step-down circuit 22 when the nMOS transistor Mb functioning as the current source is on.

The tuning circuit 21 described above can thus obtain a voltage drop of 1.75 times the voltage drop passed from the nMOS transistors Ma1–Ma*n* by turning only nMOS transistor Md4 off, can obtain a voltage drop of 1.5 times by turning only nMOS transistor Md3 off, can obtain a voltage drop of 1.25 times by turning only nMOS transistor Md2 off, and passes the voltage drop of the nMOS transistors Ma1–Man by turning only nMOS transistor Md1 off. The control circuit 24 thus changes the step-down voltage Vd, and thereby adjusts the high positive voltage Vh detected by the high voltage detection circuit 25 in small increments, by controlling the number of on nMOS transistors Ta1–Tan to adjust the number of on nMOS transistors Ma1–Man, and by controlling which nMOS transistors Td1–Td4 are on and off to further adjust the final step-down voltage Vd.

Figure 3:
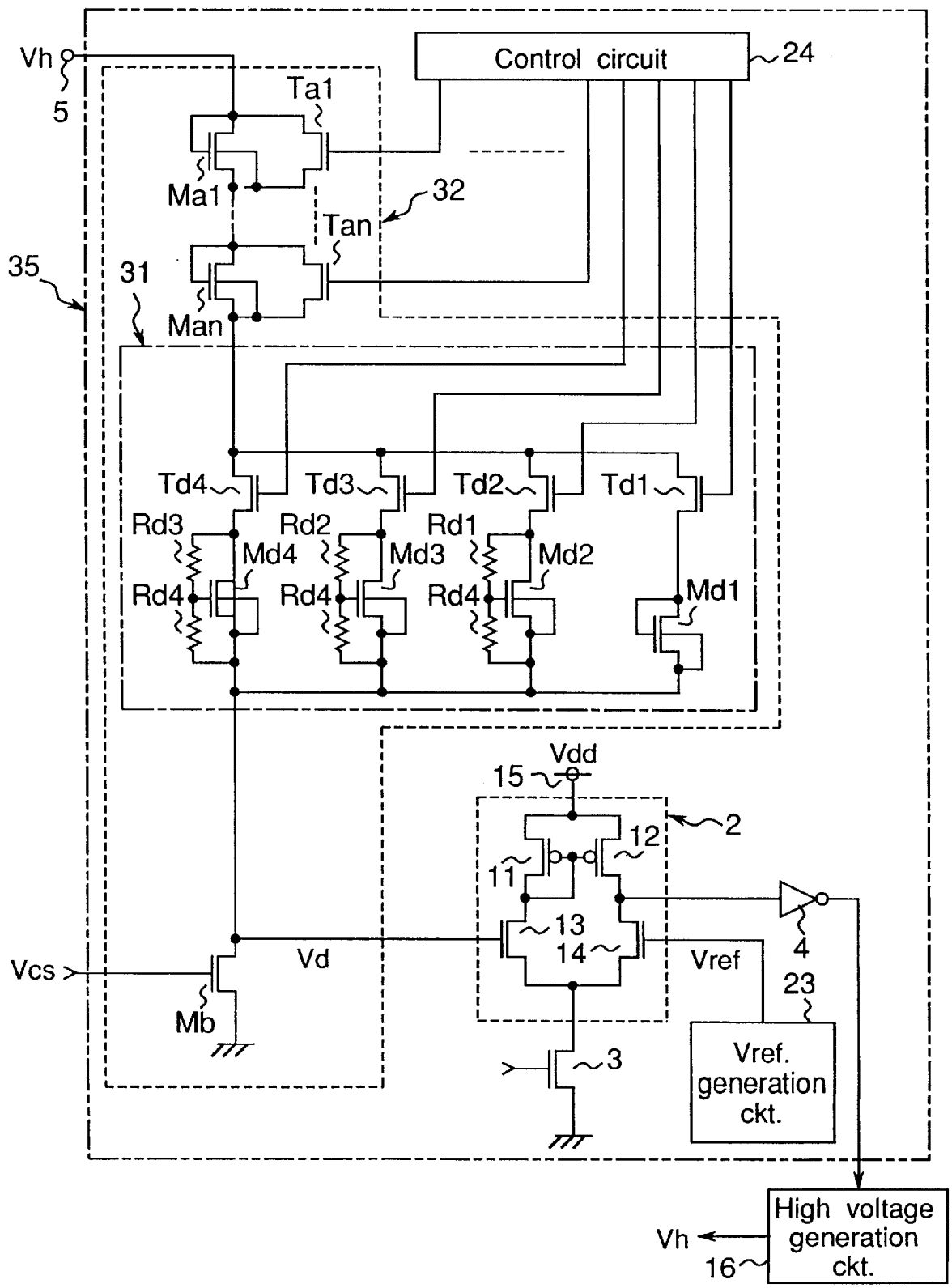
FIG. 3 is a basic circuit diagram of a high voltage detection circuit for a semiconductor integrated circuit device according to an alternative example of the second embodiment of the present invention.

FIG. 3 is a basic circuit diagram of a high voltage detection circuit 35 for a semiconductor integrated circuit device according to the second embodiment of the present invention using an alternative example of the tuning circuit 21. Note, further, that like parts are identified by the same reference numbers in FIG. 2 and FIG. 3, and further description thereof is omitted below. Only the differences from the embodiment shown in FIG. 2 are described below.

The high voltage detection circuit 35 shown in FIG. 3 comprises a differential amplifier 2, an nMOS transistor 3, an inverter 4, a high voltage step-down circuit 32, a reference voltage generator 23, and a control circuit 24.

The high voltage step-down circuit 32 steps down the high positive voltage input from the high voltage input terminal 5 to output a step-down voltage Vd. The control circuit 24 controls the high voltage step-down circuit 32 to regulate the level of the step-down voltage Vd output from the high voltage step-down circuit 32 to the differential amplifier 2.

Note, further, that the tuning circuit 31 is the tuning means of the claims, and the high voltage step-down circuit 32 functions as the high voltage step-down means.

The high voltage step-down circuit 32 comprises n nMOS transistors Ma1–Man, nMOS transistor Mb, and tuning circuit 31.

The tuning circuit 31 comprises nMOS transistors Md1–Md4 and Td1–Td4, resistances Rd1–Td3, and three resistances Rd4.

The drain of diode-connected nMOS transistor Md1 is connected to the source of nMOS transistor Td1. The drain of nMOS transistor Md2 is connected to the source of nMOS transistor Td2. Resistance Rd4 is connected between the gate and source, and resistance Rd1 is connected between the gate and drain, of nMOS transistor Md2.

The drain of nMOS transistor Md3 is likewise connected to the source of nMOS transistor Td3. Resistance Rd4 is connected between the gate and source, and resistance Rd2 is connected between the gate and drain, of nMOS transistor Md3.

The drain of nMOS transistor Md4 is likewise connected to the source of nMOS transistor Td4. Resistance Rd4 is connected between the gate and source, and resistance Rd3 is connected between the gate and drain, of nMOS transistor Md4.

The drains of nMOS transistors Td1–Td4 are connected to the source of nMOS transistor Man, and the gates are connected to the control circuit 24. The sources of nMOS transistors Md1–Md4 are connected to the drain of nMOS transistor Mb, and the line therebetween is connected to the gate of nMOS transistor 13 in differential amplifier 2.

Thus comprised, the control circuit 24 changes the step-down voltage Vd, and thereby adjusts the high positive voltage Vh detected by the high voltage detection circuit 25 in small increments, by turning a selected number of nMOS transistors Ta1–Tan on to adjust the number of on nMOS transistors Ma1–Man, and by controlling which nMOS transistors Td1–Td4 are on and off to further adjust the final step-down voltage Vd.

Figure 4:
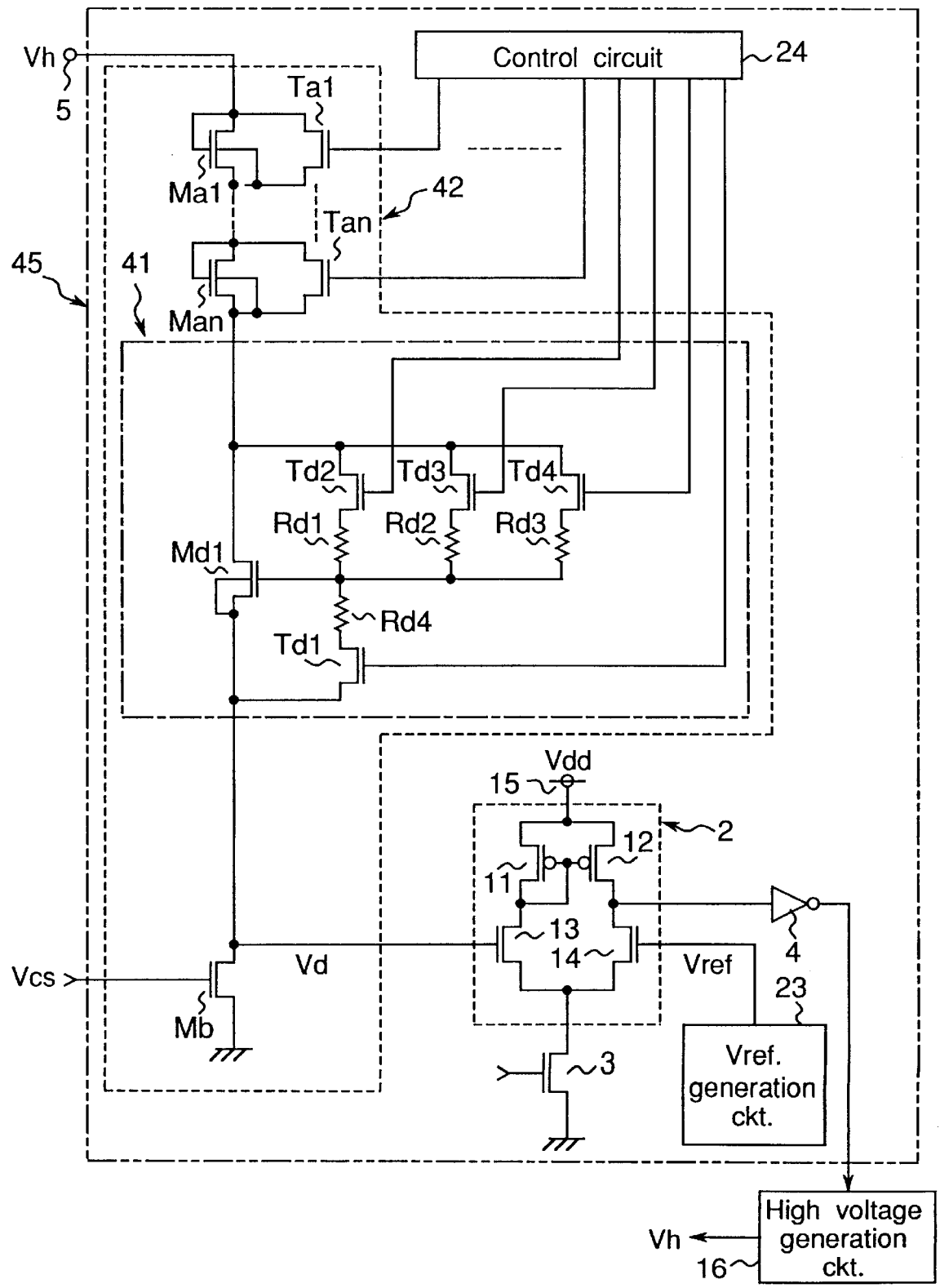
FIG. 4 is a basic circuit diagram of a high voltage detection circuit for a semiconductor integrated circuit device according to a further alternative example of the second embodiment of the present invention.

FIG. 4 is a basic circuit diagram of a high voltage detection circuit 45 for a semiconductor integrated circuit device according to the second embodiment of the present invention using a further alternative example of the tuning circuit 21. Note, further, that like parts are identified by the same reference numbers in FIG. 2 and FIG. 4, and further description thereof is omitted below. Only the differences from the embodiment shown in FIG. 2 are described below.

As in the alternative example shown in FIG. 3, the high voltage detection circuit 45 shown in FIG. 4 uses a tuning circuit 41 with a different structure, and thus comprises high voltage step-down circuit 42 in place of high voltage step-down circuit 22.

Referring to FIG. 4, the high voltage detection circuit 45 comprises a differential amplifier 2, an nMOS transistor 3, an inverter 4, a high voltage step-down circuit 42, a reference voltage generator 23, and a control circuit 24.

The high voltage step-down circuit 42 steps down the high positive voltage input from the high voltage input terminal 5 to output a step-down voltage Vd. The control circuit 24 controls the high voltage step-down circuit 42 to regulate the level of the step-down voltage Vd output from the high voltage step-down circuit 42 to the differential amplifier 2.

Note, further, that the tuning circuit 41 is the tuning means of the claims, and the high voltage step-down circuit 42 functions as the high voltage step-down means.

The high voltage step-down circuit 42 comprises n nMOS transistors Ma1–Man, nMOS transistor Mb, and tuning circuit 41.

The tuning circuit 41 comprises nMOS transistors Md1 and Td1–Td4, resistances Rd1–Rd4.

The drains of nMOS transistors Md1 and Td1–Td4 are commonly connected to the source of nMOS transistor Man. The sources of nMOS transistors Td2, Td3, and Td4 are commonly connected to the gate of nMOS transistor Md1 through, respectively, resistance Rd1, resistance Rd2, and resistance Rd3.

The drain of nMOS transistor Td1 is connected to nMOS transistor Md1 through resistance Rd4. The sources of nMOS transistors Md1 and Td1 are connected in common to the drain of nMOS transistor Mb. The gates of nMOS transistors Td1–Td4 are connected to the control circuit 24.

Thus comprised, the control circuit 24 changes the step-down voltage Vd, and thereby adjusts the high positive voltage Vh detected by the high voltage detection circuit 45 in small increments, by turning a selected number of nMOS transistors Ta1–Tan on to adjust the number of on nMOS transistors Ma1–Man, and by controlling which nMOS transistors Td1–Td4 are on and off to further adjust the final step-down voltage Vd.

For example, if the control circuit 24 turns at least one of nMOS transistors Td2 to Td4 on and turns nMOS transistor Td1 off, the tuning circuit 41 obtains the same voltage drop as that output from the nMOS transistors Ma1–Man. Furthermore, by turning nMOS transistors Td1 and Td2 on and nMOS transistors Td3 and Td4 off, the tuning circuit 41 can obtain a voltage drop 1.25 times that output from the nMOS transistors Ma1–Man.

By turning nMOS transistors Td1 and Td3 on and nMOS transistors Td2 and Td4 off, the tuning circuit 41 can obtain a voltage drop 1.5 times that output from the nMOS transistors Ma1–Man. A voltage drop 1.75 times that output from the nMOS transistors Ma1–Man is likewise achieved by turning nMOS transistors Td1 and Td4 on and nMOS transistors Td2 and Td3 off.

Figure 5:
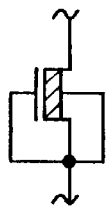
FIG. 5 is a diagram of a depletion type MOSFET.

It should be noted that the gate potential is controlled using a voltage divider built from resistances in the exemplary high voltage detection circuits shown in FIGS. 2 to 4, but to achieve this it is necessary for the current supplied to the resistances to be sufficiently less than the power supply current, i.e., for the resistances to be sufficiently high. It is, however, difficult to create high resistances with CMOS processes. This makes it necessary to use long resistance lines to obtain sufficiently high resistance, and this increases the chip size. This problem can be resolved, however, by using a depletion MOSFET as shown in FIG. 5 because depletion MOSFET devices with a negative threshold voltage can be easily produced with CMOS processes.

It will also be obvious that the values of the resistances Rd1–Rd4 in the second embodiment above are shown by way of example only, and the invention shall not be so limited. The voltage dividing ratio of the voltage divider formed by the resistances connected between the drains and sources of the nMOS transistors Md2–Md4 in tuning circuit 21 is also shown by way of example only, and the invention shall not be so limited.

It is therefore possible for a semiconductor integrated circuit device using a high voltage detection circuit according to the second embodiment of the invention to change the value of the detectable high voltages Vh in small amounts by changing the step-down voltage Vd input from the high voltage step-down circuit to the differential amplifier 2 in small increments.

It is also possible to reduce the number of resistances used in the high voltage step-down circuit, and to use nMOS transistors in place of the fewer resistances. The semiconductor integrated circuit device of the invention can therefore be achieved on a smaller chip, thus reducing cost and reducing power consumption.

Embodiment 3

Figure 6:
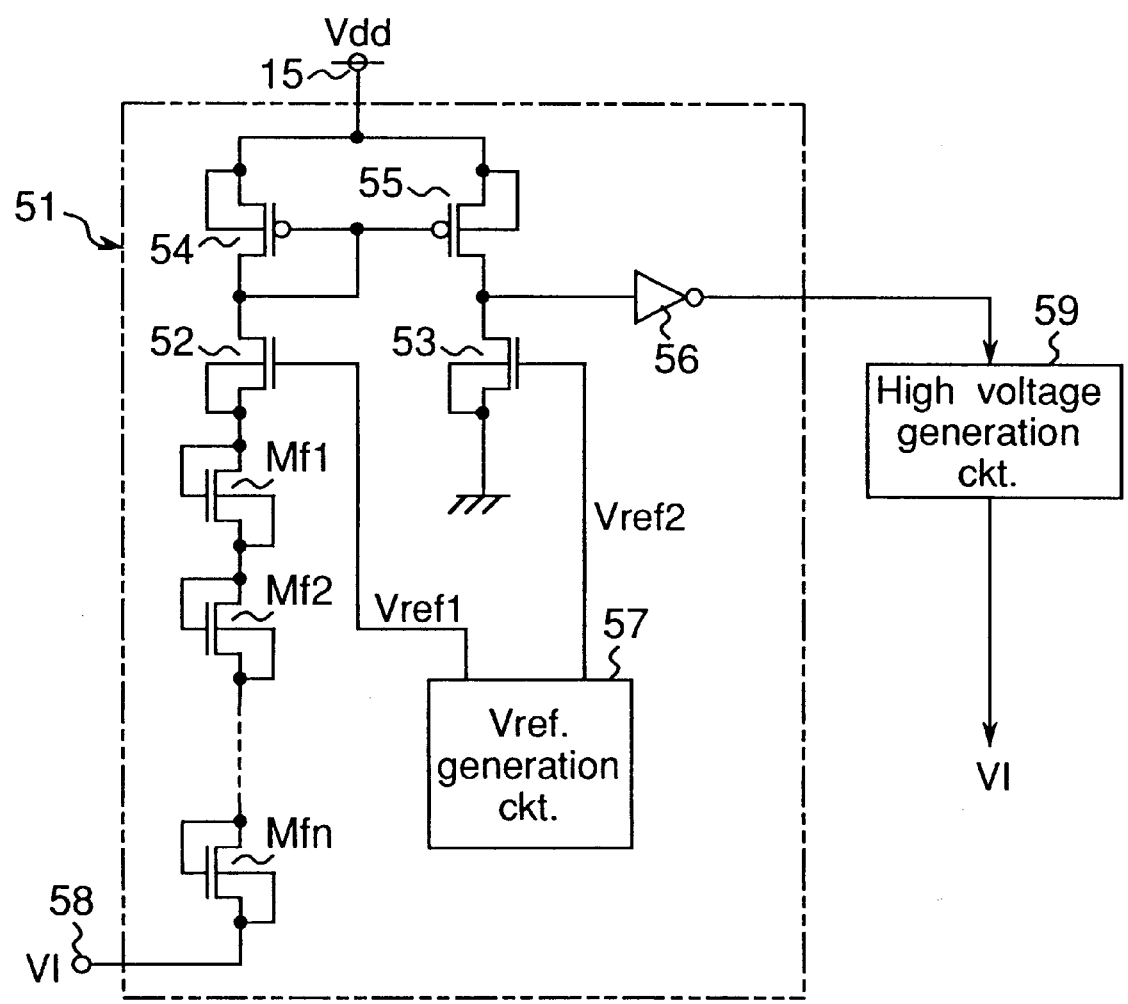
FIG. 6 is a basic circuit diagram of a high voltage detection circuit for a semiconductor integrated circuit device according to the third embodiment of the present invention.

FIG. 6 is a basic circuit diagram of a high voltage detection circuit 51 for a semiconductor integrated circuit device according to the third embodiment of the present invention. Note that a high voltage detection circuit for detecting high negative voltages is shown in FIG. 6 by way of example only. Note, also, that the same parts are identified by the reference numbers in FIG. 6 and FIG. 1, and further description thereof is omitted below.

The high voltage detection circuit 51 shown in FIG. 6 comprises nMOS transistors Mf1–Mfn, 52, and 53, pMOS transistors 54 and 55, inverter 56, and reference voltage generator 57. The diode-connected nMOS transistors Mf1–Mfn are connected in series with the drain of nMOS transistor Mf1 connected to the source of nMOS transistor 52 and the source of nMOS transistor Mfn connected to the high voltage input terminal 58 to which the high negative voltage V1 is applied.

The pMOS transistors 54 and 55 form a current mirror circuit with their gates connected to each other and the line therebetween connected to the drain of pMOS transistor 54. The sources of pMOS transistors 54 and 55 are connected to the power supply terminal 15, and the drain of pMOS transistor 54 is connected to the drain of nMOS transistor 52. The drain of pMOS transistor 55 is connected to the drain of nMOS transistor 53, the line therebetween is connected to the input to the inverter 56, and the source of nMOS transistor 53 is grounded.

The output from the inverter 56 is the output from the high voltage detection circuit 51, which inputs to the high voltage generator 59. The high voltage generator 59 comprises a charge pump circuit and outputs the high negative voltage V1.

The output of the high voltage generator 59 is supplied to a particular circuit, not shown in the figures, and to the high voltage input terminal 58. The reference voltage Vref1 is supplied from the reference voltage generator 57 to the gate of the nMOS transistor 52, and reference voltage Vref2 is likewise supplied from the reference voltage generator 57 to the gate of the pMOS transistor 53, which functions as a constant current generator.

The source and back-gate terminals of the nMOS transistors Mf1–Mfn, 52, and 53, and pMOS transistors 54 and 55, are connected to prevent variation in the respective threshold values Vth by means of the back-gate effect. The gate size is the same in all nMOS transistors Mf1–Mfn, 52, and 53, and the nMOS transistors operate in the saturation range.

It should be noted that the nMOS transistors 52 and Mf1–Mfn, and pMOS transistor 54 function as the current conversion means of the claims, the nMOS transistor 53 functions as the constant current generator, the pMOS transistors 54 and 55 as the voltage conversion means, the inverter 56 as the high voltage detection means, and the reference voltage generator 57 as the reference voltage generating means. Note, further, that reference voltage Vref1 is the first reference voltage and reference voltage Vref2 is the second reference voltage of the claims.

The current Iref flowing to the drain of nMOS transistor 53, i.e., the current Iref flowing to the constant current generator, is defined by equation [5]

$$Iref=(Kp/2)*(W/L)*(Vref2-Vth)^2 \qquad [5]$$

where W is the gate width, L is the gate length, and $Kp=\mu*$Cox. Note that $\mu$ is mobility and Cox is the capacitance of the gate oxide film.

The current mirror comprising pMOS transistors 54 and 55 causes the current Ia flowing to the series circuit of nMOS transistors Mf1–Mfn and 52 to flow to the drain of nMOS transistor 53. When Ia is less than Iref, the input to the inverter 56 is LOW and a HIGH signal is therefore output to the high voltage generator 59. This causes the high voltage generator 59 to drive the charge pump circuit and drop the high negative voltage V1. When Ia is greater than Iref, the input to the inverter 56 is HIGH and a LOW signal is therefore output to the high voltage generator 59. This causes the high voltage generator 59 to stop driving the charge pump circuit.

The threshold voltages Vth of nMOS transistor 52 and nMOS transistor 53 are the same, and a current equal to the current flowing to the drain of nMOS transistor 53 therefore flows to the series circuit comprising nMOS transistors Mf1–Mfn and 52. This current can be calculated from equation [6]

$$Iref=(Kp/2)*(W/L)*\{(Vref1-V1)/(n+1)-Vth)\}^2 \qquad [6]$$

Equation [7]

$$Vref2=(Vref1-V1)/(n+1) \quad [7]$$

can be derived from equations [5] and [6], and equation [8] can be derived from equation [7].

$$V1=Vref1-(n+1)*Vref2 \quad [8]$$

The high negative voltage V1 defined by equation [8] is thus detected by the high voltage detection circuit 51 according to the third embodiment of the invention.

A semiconductor integrated circuit device comprising a high voltage detection circuit according to the third embodiment of the invention can thus detect high negative voltages using a simple circuit design. The number of elements required for a high negative voltage detection circuit can thus be reduced. Manufacturing differences in the high negative voltage detection circuit can therefore be reduced, thus improving high voltage detection precision and reducing device cost.

Embodiment 4

Figure 7:
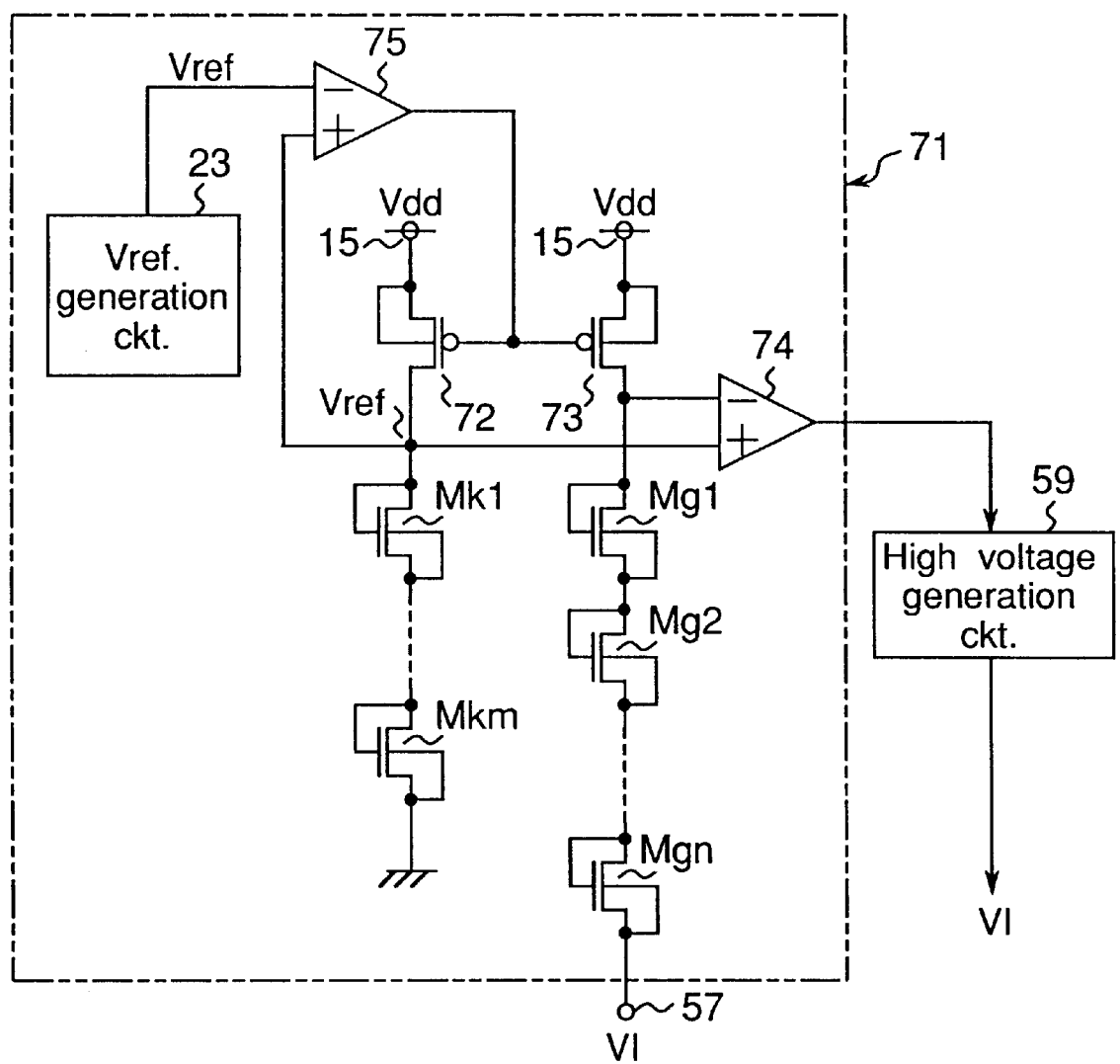
FIG. 7 is a basic circuit diagram of a high voltage detection circuit for a semiconductor integrated circuit device according to the fourth embodiment of the present invention.
Figure 8:
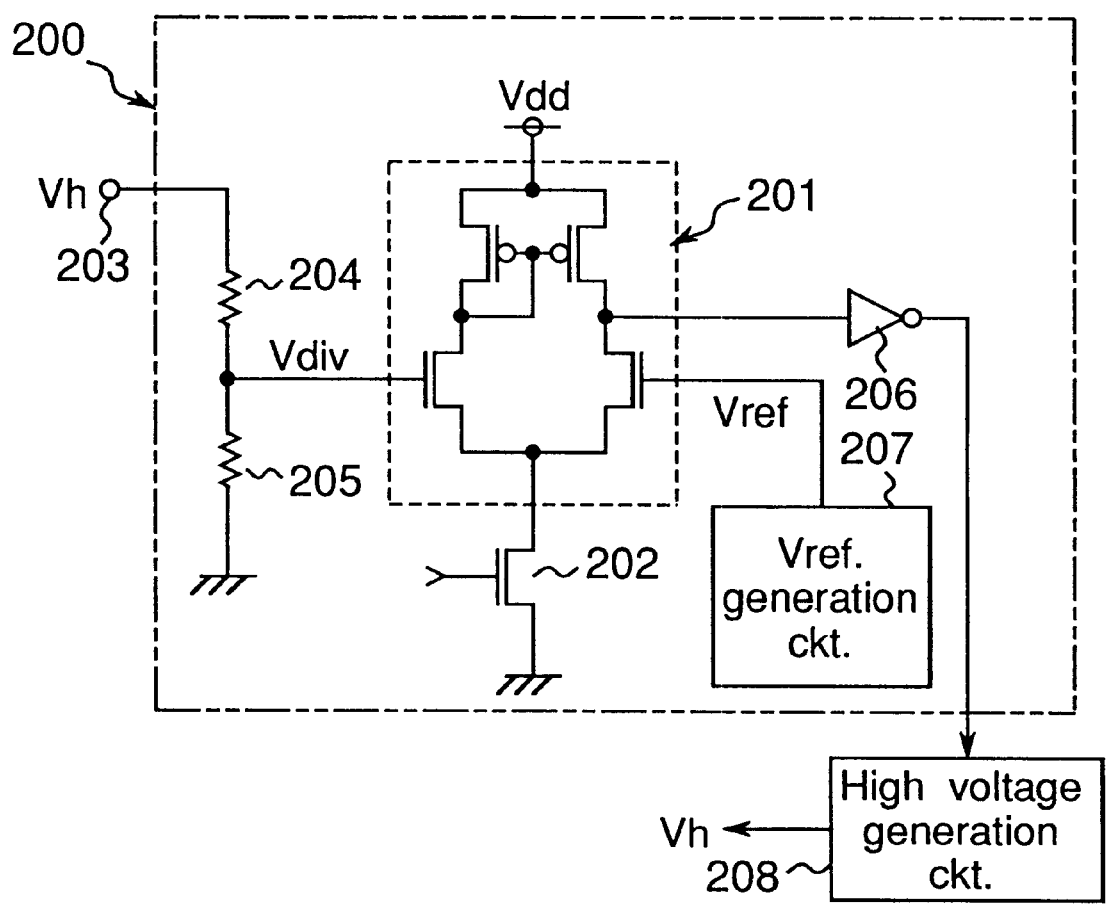
FIG. 8 is a basic circuit diagram of a conventional high voltage detection circuit for detecting high positive voltages.
Figure 9:
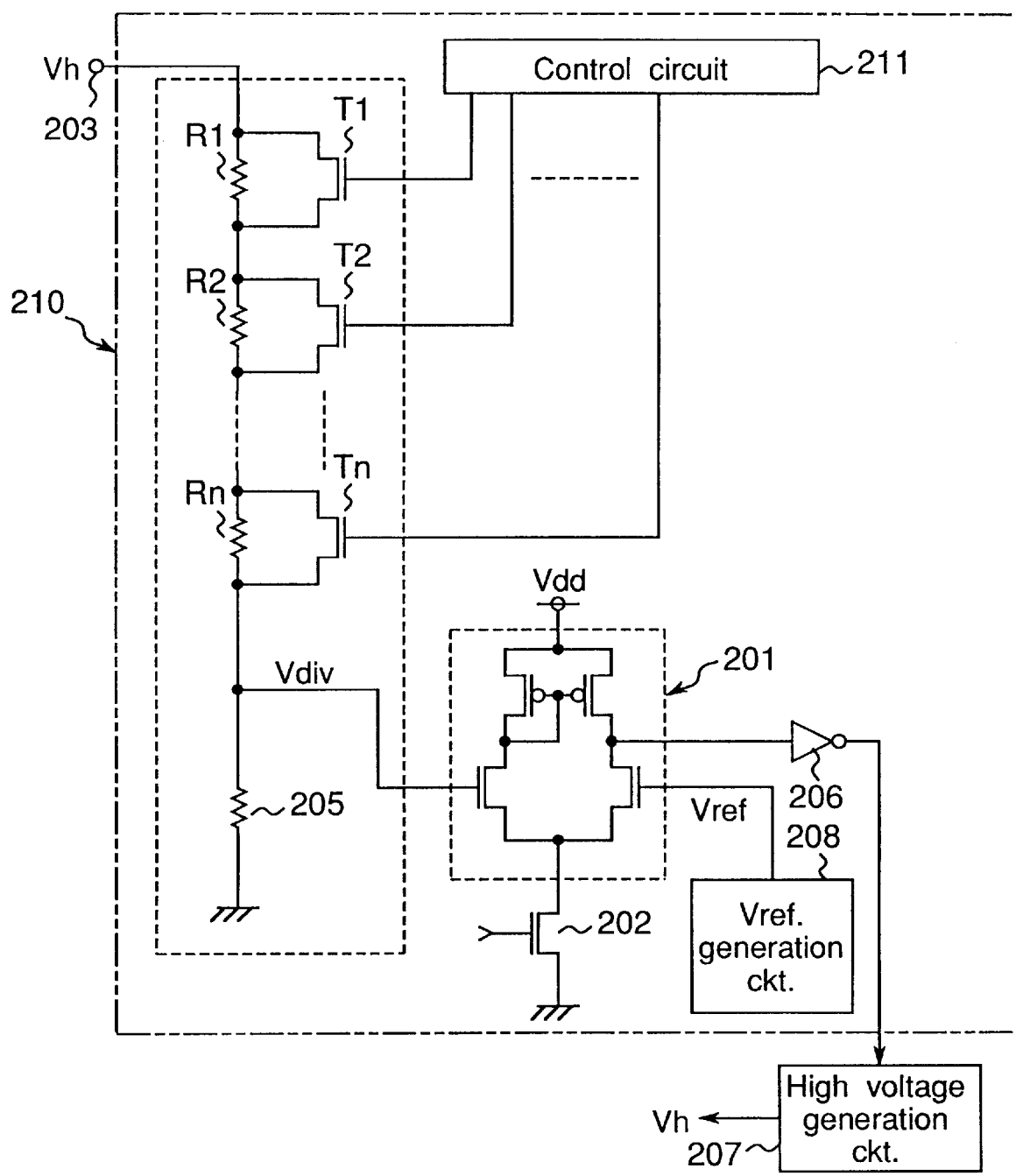
FIG. 9 is a basic circuit diagram of another conventional high voltage detection circuit for detecting high positive voltages.
Figure 10:
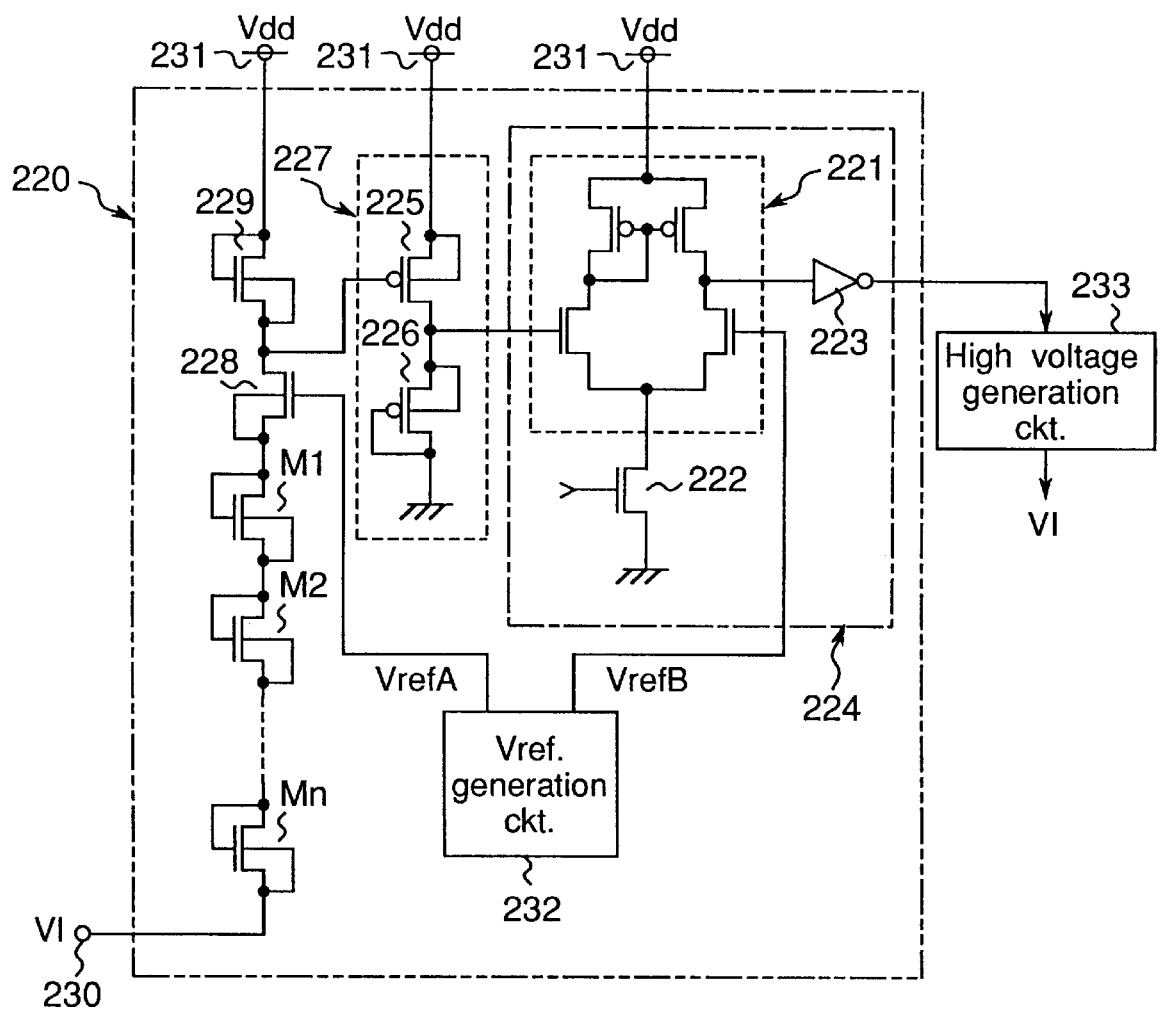
FIG. 10 is a basic circuit diagram of a conventional high voltage detection circuit for detecting high negative voltages.

FIG. 7 is a basic circuit diagram of a high voltage detection circuit 51 for a semiconductor integrated circuit device according to the fourth embodiment of the present invention. Note that a high voltage detection circuit for detecting high negative voltages is shown in FIG. 7 by way of example only. Note, also, that the same parts are identified by the reference numbers in FIG. 7, FIG. 6 and FIG. 1, and further description thereof is omitted below.

The high voltage detection circuit 71 shown in FIG. 7 comprises n (where n is a natural number) nMOS transistors Mg1–Mgn, m (where m is a natural number) nMOS transistors Mk1–Mkn, pMOS transistors 72 and 73, and differential amplifiers 74 and 75. The diode-connected nMOS transistors Mg1–Mgn are connected in series with the drain of nMOS transistor Mg1 connected to the drain of pMOS transistor 73, and the line therebetween connected to the inverting input of the differential amplifier 74.

The source of nMOS transistor Mgn is connected to the high voltage input terminal 57 to which the high negative voltage V1 is applied. The source of pMOS transistor 73 is connected to the power supply terminal 15.

The gate of pMOS transistor 72 is connected to the gate of pMOS transistor 73, and the line therebetween is connected to the output of differential amplifier 75. The diode-connected nMOS transistors Mk1–Mkn are connected in series with the drain of nMOS transistor Mk1 connected to the drain of pMOS transistor 72, and the line therebetween connected to the non-inverting input of differential amplifiers 74 and 75. The source of nMOS transistor Mkm is grounded. The source of pMOS transistor 72 is connected to the power supply terminal 15. A reference voltage Vref is supplied to the inverting terminal of differential amplifier 75. The output of differential amplifier 74 is the output of the high voltage detection circuit 71, and is supplied to the input of the high voltage generator 59.

The source and back-gate terminals of the nMOS transistors Mg1–Mgn, Mk1–Mkm, and pMOS transistors 72 and 73, are connected to prevent variation in the respective threshold values Vth by means of the back-gate effect. The gate size is the same in all nMOS transistors Mg1–Mgn and Mk1–Mkm, and the nMOS transistors operate in the saturation range. The gate size is also the same in pMOS transistors 72 and 73.

It should be noted that nMOS transistors Mk1–Mkm function as the first voltage step-down means of the claims, nMOS transistors Mg1–Mgn function as the second voltage step-down means, pMOS transistors 72 and 73 and differential amplifier 75 function as the constant current generating means, and differential amplifier 74 functions as the high voltage detection means.

In the high voltage detection circuit 71 thus comprised, the differential amplifier 75 uses a feedback loop to apply a voltage to the gate of pMOS transistor 72 so that the current flowing from the pMOS transistor 72 to the series circuit of nMOS transistors Mk1–Mkm generates reference voltage Vref. The voltage applied to the gate of pMOS transistor 72 is simultaneously applied to the gate of pMOS transistor 73, and the current from the pMOS transistor 73 flows to the series circuit of nMOS transistors Mg1–Mgn.

When the same potential is applied to both inputs of differential amplifier 74, pMOS transistors 72 and 73 supply the same current to the downstream series circuits. The voltage drop in the series circuit of nMOS transistors Mg1–Mgn at this time is (Vref−V1), and equation [9] is true.

$$Vref-V1=(n/m)*Vref \quad [9]$$

As a result, the high voltage detection circuit 71 can detect the high negative voltage determined by equation [10].

$$V1=(n/m-1)*Vref \quad [10]$$

As is obvious from equation [10], it is therefore possible to adjust the level of the detectable high negative voltage V1 by changing the number of nMOS transistors as expressed by the values of n and m.

With the semiconductor integrated circuit device according to the fourth embodiment of the invention thus comprised, the current flowing to the series circuit of nMOS transistors Mk1–Mkm and the current flowing to the series circuit of nMOS transistors Mg1–Mgn are, in principle, the same and unaffected by temperature and power supply voltage. It is therefore possible to provide a semiconductor integrated circuit device with greater stability and resistance to environmental changes. High voltage detection precision can therefore be improved, and the value of the detectable high voltage V1 can be adjusted in fine increments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor integrated circuit device with a high voltage detection circuit for detecting high voltage levels, comprising:

a high voltage step-down means for stepping down a high voltage input and outputting the stepped-down voltage;

a reference voltage generating means for generating and outputting a reference voltage;

a high voltage detection means for comparing the voltage output from said high voltage step-down means and the reference voltage output from said reference voltage generating means to detect a high voltage; and a controller for controlling a voltage drop of the high voltage imparted by said high voltage step-down means to set the high voltage detected by the high voltage detection means;

wherein said high voltage step-down means comprises a voltage step-down means for stepping down the voltage in specific integer multiples of a predetermined voltage;

a tuning means for stepping down the voltage in steps less than an integer multiple of said predetermined voltage; and a current supply for supplying current to said voltage step-down means and the tuning means, and wherein said controller is configured to control the voltage drop by the voltage step-down means and tuning means to control the voltage output from said high voltage step-down means and thereby set the high voltage detected by said high voltage detection means.

2. The semiconductor integrated circuit device according to claim 1, wherein the voltage step-down means comprises a voltage step-down circuit comprising at least two diode-connected MOSFETs connected in series, and a first switching circuit comprising switching elements for shorting the drain and source of each MOSFET of said voltage step-down circuit by a switching operation, and said controller sets the high voltage value detected by said high voltage detection means by controlling the operation of each switching element in said first switching circuit to control the voltage drop of the high voltage by said high voltage step-down means, and thereby controls the voltage output from said high voltage step-down means.

3. The semiconductor integrated circuit device according to claim 2, wherein said tuning means comprises a fine-tuning circuit connected in series with said voltage step-down circuit, said fine-tuning circuit comprising at least two serially connected MOSFETs where a voltage dividing circuit formed by a resistance is connected between the source and drain of each MOSFET, and the voltage divided by said voltage dividing circuit is input to the MOSFET gate, and a second switching circuit comprising for each MOSFET in said fine-tuning circuit, a switching element that is switched to short the drain and source of the corresponding MOSFET, and said controller is configured to set the high voltage value detected by said high voltage detection means by controlling the operation of each switching element in said second switching circuit to adjust in small increments the voltage drop of the high voltage of said high voltage step-down means, and thereby control the voltage output from said high voltage step-down means in small increments.

4. The semiconductor integrated circuit device according to claim 2, wherein said tuning means is a fine-tuning circuit connected in series with said voltage step-down circuit, said fine-tuning circuit comprising a series circuit, each series circuit having a first MOSFET, which has a second MOSFET connected in parallel therewith and has a voltage dividing circuit formed from a resistance connected between the source and drain of the second MOSFET with the voltage divided by said voltage dividing circuit input to the first MOSFET gate, and a switching MOSFET connected in series with said first MOSFET, and wherein said controller is configured to set the high voltage value detected by said high voltage detection means by controlling the switching operation of each switching MOSFET to adjust in small increments the voltage drop of said high voltage by the high voltage step-down means, and thereby control said voltage output from the high voltage step-down in small increments.

5. The semiconductor integrated circuit device according to claim 2, wherein and tuning means is a fine-tuning circuit connected in series with said voltage step-down circuit, said fine-tuning circuit comprises a MOSFET with at least two series circuits, each of the series circuit having a resistance and a switching MOSFET, one of the series circuits being connected between the gate and drain of the MOSFET and another one of the circuit being connected between the gate and source of the MOSFET, and wherein said controller is configured to set the high voltage value detected by said high voltage detection means by controlling the switching operation of each switching MOSFET to adjust in small increments the voltage drop of said high voltage by the high voltage step-down means, and thereby control the voltage output from said high voltage step-down means in small increments.

6. A semiconductor integrated circuit device with high voltage detection circuit for detecting high voltage levels, comprising:

a first voltage step-down means of at least two diode-connected MOSFETs connected in series, the first voltage step-down means being coupled between a first node and ground;

a second voltage step-down means of at least two diode-connected MOSFETs connected in series, the second voltage step-down means being coupled between a second node and a third node, the third node being applied with a high negative voltage;

a reference voltage generating means for outputting a reference voltage;

a constant current generator for receiving a voltage at the first node and the reference voltage and for outputting a constant current to the first and second nodes, and a high voltage detection means for comparing the voltage at the first node and a voltage at the second node to detect the high voltage value.

* * * * *